Oct. 18, 1960 V. SILS 2,957,112

TREATMENT OF TANTALUM SEMICONDUCTOR ELECTRODES

Filed Dec. 9, 1957

WITNESSES:
Bernard R. Gieguey
Charles L. Menzemer

INVENTOR
Victor Sils
BY
Frederick Shapoe
ATTORNEY

United States Patent Office 2,957,112

Patented Oct. 18, 1960

2,957,112

TREATMENT OF TANTALUM SEMICONDUCTOR ELECTRODES

Victor Sils, South Greensburg, Pa., assignor to Westinghouse Electric Corporation, East Pittsburgh, Pa., a corporation of Pennsylvania Filed Dec. 9, 1957, Ser. No. 701,548

2 Claims. (Cl. 317—234)

The present invention relates to the treatment of tantalum metal, and has particular reference to improving the wettability of tantalum components of semiconductor devices by applied solders.

One known method for preparing a semiconductor device comprises soldering a silicon or germanium element to a base electrode comprised of any suitable metal such as molybdenum, tungsten, tantalum or the like. A tantalum counterelectrode is then soldered to the silicon or germanium element.

The soldering of the tantalum member to the silicon or germanium element is not uniformly good if chemically active gases, for example oxygen, hydrogen, nitrogen, water vapor and the like, are present since these gases appear to inhibit the ability of the tantalum to be wet by the solder. In commercial production, the elements are ordinarily assembled and soldered in one operation and the maintenance of a high vacuum or inert atmosphere is difficult.

The object of the present invention is to provide a process for improving the wettability of tantalum members by solders by reducing the sensitivity of the tantalum to chemically active gases.

Another object of the present invention is to provide a process for improving the wettability of tantalum members by applied solders by precoating the tantalum with a metal selected from the group comprising gold, silver, indium and tin.

Another object of the present invention is to provide a process for improving the bond between a semiconductor element and a tantalum element by precoating the tantalum with a vaporized metal selected from the group comprising gold, silver, indium and tin.

Other objects of this invention will, in part, be obvious and will, in part, appear hereinafter.

For a better understanding of the nature and objects of this invention, reference should be had to the following detailed description and drawings, in which.

In accordance with the present invention and in the attainment of the foregoing objects, broadly there is provided in the process of assembling a semiconductor device, said device comprising a semiconductor element and electrodes applied thereto, and at least one of said electrodes being comprised of tantalum metal, which process includes the step of joining by soldering the above-stated components, the improvement which comprises precoating the tantalum metal electrodes with a layer of from about 0.00001 to 0.0005 inch thickness of a metal selected from the group consisting of gold, silver, indium and tin to improve the wettability of said tantalum by applied solders.

Figure 1:
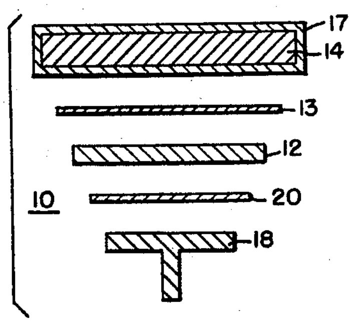
Figure 1 is an exploded front view, in cross-section, of a semiconductor device.

More specifically, Figure 1 illustrates one type of semiconductor device 10 which is comprised of a semiconductor element 12 which may comprise N-silicon, P-silicon, N-germanium, P-germanium or suitably doped silicon-germanium alloys thereof, or other semiconductor materials. The element 12 is joined by a suitable solder 13 to a base contact member 14 which may comprise any suitable metal such as molybdenum, tantalum, tungsten or the like. In the specific device illustrated, member 14 is provided with a nickel coating 17 to facilitate soldering the same to the semiconductor die or wafer element 12 as well as to other components. The solder 13 may comprise any silver, gold, tin, aluminum or the like ohmic solder capable of joining member 12 to coating 17 of member 14. The term "solder" as used herein includes both soft solders and brazing alloys. A silver-lead-antimony solder comprising 97% silver, 2% lead and 1% antimony has been found to be particularly satisfactory when the element 12 is N-type silicon. A tin base solder comprising 60% tin, 39% lead, and 1% antimony may also be used for N-type germanium or silicon. A pure aluminum or a pure indium solder will be satisfactory when the element 12 is P-type germanium.

A tantalum electrode 18 is joined to the semiconductor element 12 by a solder 20 capable of converting the element 12 in contact therewith to the opposite type of semiconductivity. In order to provide a good soldered bond to the solder 20, the tantalum electrode is coated with a metal selected from the group consisting of gold, indium, tin and silver. The composition of the particular solder 20 is dependent upon the particular semiconductivity of element 12 employed. If said element 12 is comprised of N-silicon, an aluminum-silicon solder comprising 89% aluminum and 11% silicon has been found to be quite satisfactory. If element 12 is comprised of P-silicon, a gold base solder comprising 99% gold and 1% antimony or 94% gold, 5% lead, and 1% arsenic has been satisfactory. If the element 12 is N-germanium, satisfactory solders comprise 100% indium, or 100% aluminum, or 49% indium, 45% gold, 5% germanium and 1% aluminum. If element 12 is P-germanium, a lead base solder comprising 90% lead and 10% antimony or 99% lead and 1% arsenic has been found to be satisfactory. The various components of the semiconductor device may be assembled in one operation.

Figure 2:
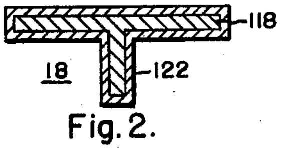
Fig. 2 is an enlarged front view, in cross-section, of a metal coating tantalum counterelectrode.

Figure 2 illustrates a tantalum counterelectrode 118 with an applied metal coating 122 suitable for use in the assembly of Fig. 1. Said metal coating comprises at least one metal selected from the group consisting of gold, silver, indium and tin.

Figure 3:
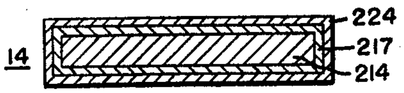
Fig. 3 is an enlarged front view, in cross-section, of a double-coated semiconductor tantalum base member.

Figure 3 illustrates a tantalum base member 214 coated with an inner protective metal layer 217, said protective layer comprising at least one metal selected from the group consisting of nickel, iron and cobalt, and an outer solder wettable layer 224, said solder wetting layer comprising at least one of the metals selected from the group comprising gold, silver, indium and tin. The member 214 is suitable for use in the base electrode member 14 in Fig. 1.

While Figures 2 and 3 show two different tantalum components, it should be understood that these components may be square, circular, hexagonal or any other suitable shape.

Figure 4:
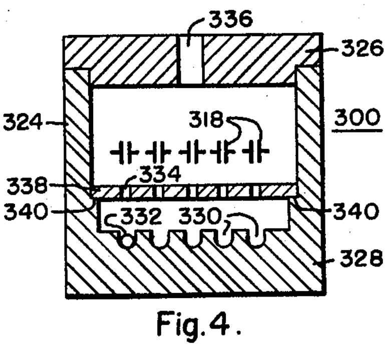
Fig. 4 is a front view, in cross-section, of a crucible suitable for use in accordance with this invention.

Figure 4 illustrates a graphite crucible 300 suitable for coating tantalum semiconductor components in accordance with this invention. The graphite crucible 300 is comprised of a base member 328, side 324 integral with said base member 328 and a removable top member 326. The inside bottom surface of said base member 328 is comprised of grooves or cavities 330. The side 324 has a ledge 340 upon which rests a screen 338 of graphite or other suitable material. Said ledge 340 is substantially closer to said grooves or cavities 330 than to said top member 326.

A predetermined quantity of a suitable metal 332 is charged into the grooves or cavities 330. The metal 332 is selected from at least one of the group consisting of gold, silver, indium and tin. Thus, a 10% silver and 90% gold alloy may be used as metal 332.

Tantalum semiconductor components, which may comprise counterelectrodes or base member admixed or individually, are charged onto the screen 338. The top member 326 is positioned and the crucible evacuated through any suitable exit such as opening 336 in the top member 326. While maintaining the vacuum, the crucible is heated in a furnace to a temperature sufficient to vaporize the metal 332 and such temperature is maintained for a period of time sufficient to insure coating the tantalum semiconductor components. Satisfactory results have been obtained with maintaining temperatures in the range of 1000° C. to 1500° C. for a period of 10 minutes to 3 minutes, the time being inversely proportional to the temperature. However, the most satisfactory results have been realized when using temperatures in the range of 1200° C. to 1500° C., which are employed for a period of 7 minutes to 3 minutes. If the operation is carried on for too long a period, for example 15 minutes at 1700° C., the tantalum body will disintegrate.

The metal vapor passes from grooves 330 through openings 334 in the screen 338 and contacts the surfaces of the tantalum components 318. After contacting the tantalum components, the vapor passes from the crucible through the opening 336 in the crucible top.

Solders applied to the tantalum components so coated uniformly wetted 100% of the applied surface.

The following examples are illustrative of the practice of this invention.

Extremely thin coatings of gold, silver, tin and indium may be applied to the tantalum electrode members with satisfactory solder wetting properties being secured. Thus, the coatings may be from 0.00001 to 0.0005 inch in thickness.

*Example I*

0.1 gram of gold powder is charged into cavities in the bottom of a graphite crucible such as shown in Fig. 4, and 1500 tantalum counterelectrode members such as 18 in Fig. 1 and having a diameter of 0.1 inch, are placed onto a screen 338 located above the gold powder. The top is placed on the crucible and the crucible is evacuated to a pressure $10^{-4}$ mm. Hg. While maintaining vacuum, the crucible is heated in a furnace at 1500° C. for approximately 3 minutes.

The tantalum semiconductor components thus treated have a gold layer of approximately 0.0001 inch and analysis showed that the gold vapor had penetrated to a depth of approximately 0.001 inch into the tantalum component.

The treated surface of all the components was completely wettable by solder.

Example I is repeated substituting silver, indium and tin, respectively, for the gold with equally satisfactory results.

Equally satisfactory results are achieved by heating the charged crucible to 1200° C. for 7 minutes or 1400° C. for 5 minutes.

While the tantalum components have been illustrated as applied to a diode, it should be understood that the coated tantalum electrode members of this invention can be applied to transistors and other semiconductor devices with equally satisfactory results.

Since certain changes in carrying out the above process may be made without departing from its scope, it is intended that the accompanying description and drawings be interpreted as illustrative and not limiting.

I claim as my invention:

1. A junction type semiconductor device comprising a semiconductor element having at least one zone of a first type of semiconductivity and at least one zone of a second type semiconductivity, metal electrodes, and a solder layer having a lower melting point than the metal electrodes joining the metal electrodes to the zones of the semiconductor element, at least one of said metal electrodes being comprised of tantalum metal coated only with a metal selected from at least one of the group consisting of gold, silver, indium and tin.

2. A junction type semiconductor device comprising a semiconductor element having at least one zone of a first type of semiconductivity and at least one zone of a second type semiconductivity, metal electrodes, and a solder layer having a lower melting point than the metal electrodes joining the metal electrodes to the zones of the semiconductor element, at least one of said metal electrodes being comprised of tantalum metal having a coating of only a metal selected from at least one of the group consisting of gold, silver, indium and tin, said coating having a thickness in the range of from about 0.00001 inch to 0.0005 inch.

References Cited in the file of this patent

UNITED STATES PATENTS

| | | |
|---|---|---|
| 2,763,822 | Frola et al. | Sept. 18, 1956 |
| 2,782,492 | Frost | Feb. 26, 1957 |
| 2,792,538 | Pfann | May 14, 1957 |
| 2,793,420 | Johnston et al. | May 28, 1957 |
| 2,818,536 | Carman et al. | Dec. 31, 1957 |
| 2,820,932 | Looney | Jan. 21, 1958 |
| 2,842,831 | Pfann | July 15, 1958 |